(12) United States Patent
Bogue et al.

(10) Patent No.: US 10,214,824 B2
(45) Date of Patent: *Feb. 26, 2019

(54) EROSION AND WEAR PROTECTION FOR COMPOSITES AND PLATED POLYMERS

(71) Applicant: UNITED TECHNOLOGIES CORPORATION, Farmington, CT (US)

(72) Inventors: William Bogue, Hebron, CT (US); Grant O. Cook, III, Spring, TX (US); Gary M. Lomasney, Glastonbury, CT (US); Joseph Parkos, East Haddam, CT (US); Colin J. Kling, Middletown, CT (US); Charles R. Watson, Windsor, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 261 days.

This patent is subject to a terminal disclaimer.

(21) Appl. No.: 14/903,880

(22) PCT Filed: Jul. 9, 2014

(86) PCT No.: PCT/US2014/046012
§ 371 (c)(1),
(2) Date: Jan. 8, 2016

(87) PCT Pub. No.: WO2015/006487
PCT Pub. Date: Jan. 15, 2015

(65) Prior Publication Data
US 2016/0368238 A1 Dec. 22, 2016

Related U.S. Application Data

(60) Provisional application No. 61/844,108, filed on Jul. 9, 2013.

(51) Int. Cl.
*B21D 39/00* (2006.01)
*C25D 5/56* (2006.01)
(Continued)

(52) U.S. Cl.
CPC ............ *C25D 5/56* (2013.01); *B05D 5/00* (2013.01); *B05D 7/02* (2013.01); *B22C 7/023* (2013.01);
(Continued)

(58) Field of Classification Search
None
See application file for complete search history.

(56) References Cited

U.S. PATENT DOCUMENTS 4,315,970 A 2/1982 McGee
4,888,247 A 12/1989 Zweben et al.
(Continued)

FOREIGN PATENT DOCUMENTS

EP 043174 A2 11/1996
EP 2281746 A2 2/2011
(Continued)

OTHER PUBLICATIONS

English Abstract for Japanese application No. JP06170514A; Filing date: Jun. 21, 1994.
(Continued)

*Primary Examiner* — Seth Dumbris
(74) *Attorney, Agent, or Firm* — Cantor Colburn LLP

(57) ABSTRACT

A composite component and a plated polymer component are disclosed. The composite component may comprise a body portion formed from an organic matrix composite, a first metal coating applied to a surface of the body portion, and an outer metal layer on the first metal coating that is erosion-resistant. The plated polymer component may comprise a polymer substrate, a metal plating layer applied to a
(Continued)

surface of the polymer substrate, and at least one selectively thickened region in the metal plating layer. The at least one selectively thickened region may assist in protecting the plated polymer component against wear and/or erosion.

9 Claims, 4 Drawing Sheets

(51) Int. Cl.
| | |
|---|---|
| B33Y 80/00 | (2015.01) |
| B05D 5/00 | (2006.01) |
| B05D 7/02 | (2006.01) |
| B22C 7/02 | (2006.01) |
| B22C 9/04 | (2006.01) |
| B22C 9/10 | (2006.01) |
| B22F 3/22 | (2006.01) |
| B22F 5/04 | (2006.01) |
| B28B 1/24 | (2006.01) |
| B28B 7/34 | (2006.01) |
| B28B 11/04 | (2006.01) |
| B28B 11/24 | (2006.01) |
| B32B 3/26 | (2006.01) |
| B32B 7/12 | (2006.01) |
| B32B 15/04 | (2006.01) |
| B32B 15/08 | (2006.01) |
| B32B 15/20 | (2006.01) |
| B32B 37/12 | (2006.01) |
| B32B 37/14 | (2006.01) |
| B62D 35/00 | (2006.01) |
| B64C 39/02 | (2006.01) |
| C04B 35/76 | (2006.01) |
| C04B 35/80 | (2006.01) |
| C09D 5/26 | (2006.01) |
| C23C 14/20 | (2006.01) |
| C23C 16/06 | (2006.01) |
| C23C 18/16 | (2006.01) |
| C23C 18/20 | (2006.01) |
| C23C 18/22 | (2006.01) |
| C23C 18/31 | (2006.01) |
| C23C 26/00 | (2006.01) |
| C23C 28/02 | (2006.01) |
| C25D 3/02 | (2006.01) |
| C25D 3/38 | (2006.01) |
| C25D 3/46 | (2006.01) |
| C25D 5/48 | (2006.01) |
| C25D 9/04 | (2006.01) |
| C25D 11/20 | (2006.01) |
| F01D 5/00 | (2006.01) |
| F01D 5/14 | (2006.01) |
| F01D 5/18 | (2006.01) |
| F01D 5/28 | (2006.01) |
| F01D 9/02 | (2006.01) |
| F01D 9/04 | (2006.01) |
| F01D 11/08 | (2006.01) |
| F01D 25/00 | (2006.01) |
| F04D 29/02 | (2006.01) |
| F04D 29/32 | (2006.01) |
| F04D 29/54 | (2006.01) |
| F42B 10/02 | (2006.01) |
| B33Y 10/00 | (2015.01) |

(52) U.S. Cl.
CPC ............... *B22C 9/043* (2013.01); *B22C 9/10* (2013.01); *B22F 3/225* (2013.01); *B22F 5/04* (2013.01); *B28B 1/24* (2013.01); *B28B 7/342* (2013.01); *B28B 11/04* (2013.01); *B28B 11/243* (2013.01); *B32B 3/263* (2013.01); *B32B 7/12* (2013.01); *B32B 15/04* (2013.01); *B32B 15/08* (2013.01); *B32B 15/20* (2013.01); *B32B 37/12* (2013.01); *B32B 37/1284* (2013.01); *B32B 37/14* (2013.01); *B33Y 80/00* (2014.12); *B62D 35/00* (2013.01); *B64C 39/024* (2013.01); *B64C 39/028* (2013.01); *C04B 35/76* (2013.01); *C04B 35/806* (2013.01); *C09D 5/26* (2013.01); *C23C 14/20* (2013.01); *C23C 16/06* (2013.01); *C23C 18/165* (2013.01); *C23C 18/1633* (2013.01); *C23C 18/2013* (2013.01); *C23C 18/22* (2013.01); *C23C 18/31* (2013.01); *C23C 26/00* (2013.01); *C23C 28/02* (2013.01); *C25D 3/02* (2013.01); *C25D 3/38* (2013.01); *C25D 3/46* (2013.01); *C25D 5/48* (2013.01); *C25D 9/04* (2013.01); *C25D 11/20* (2013.01); *F01D 5/00* (2013.01); *F01D 5/147* (2013.01); *F01D 5/187* (2013.01); *F01D 5/284* (2013.01); *F01D 5/288* (2013.01); *F01D 9/02* (2013.01); *F01D 9/041* (2013.01); *F01D 11/08* (2013.01); *F01D 25/005* (2013.01); *F04D 29/023* (2013.01); *F04D 29/324* (2013.01); *F04D 29/542* (2013.01); *F42B 10/02* (2013.01); *B32B 2255/10* (2013.01); *B32B 2307/202* (2013.01); *B32B 2307/554* (2013.01); *B32B 2603/00* (2013.01); *B33Y 10/00* (2014.12); *B64C 2201/10* (2013.01); *F05D 2220/32* (2013.01); *F05D 2230/10* (2013.01); *F05D 2230/22* (2013.01); *F05D 2230/30* (2013.01); *F05D 2230/312* (2013.01); *F05D 2230/314* (2013.01); *F05D 2240/122* (2013.01); *F05D 2240/304* (2013.01); *F05D 2300/10* (2013.01); *F05D 2300/11* (2013.01); *F05D 2300/121* (2013.01); *F05D 2300/132* (2013.01); *F05D 2300/133* (2013.01); *F05D 2300/1616* (2013.01); *F05D 2300/171* (2013.01); *F05D 2300/177* (2013.01); *F05D 2300/20* (2013.01); *F05D 2300/30* (2013.01); *F05D 2300/44* (2013.01); *F05D 2300/501* (2013.01); *F05D 2300/603* (2013.01); *F05D 2300/611* (2013.01); *F05D 2300/614* (2013.01)

(56) References Cited

U.S. PATENT DOCUMENTS

| | | |
|---|---|---|
| 5,658,506 A | 8/1997 | White et al. |
| 5,839,882 A | 11/1998 | Finn et al. |
| 5,854,142 A | 12/1998 | Inoguchi et al. |
| 5,931,641 A | 8/1999 | Finn et al. |
| 6,159,589 A | 12/2000 | Isenberg et al. |
| 6,426,143 B1 | 7/2002 | Voss et al. |
| 6,458,451 B1 * | 10/2002 | Steidl ............... B32B 15/04 428/308.4 |
| 6,551,063 B1 | 4/2003 | Lee et al. |
| 6,626,230 B1 | 9/2003 | Woodrum et al. |
| 6,982,116 B1 | 1/2006 | Passman et al. |
| 7,452,454 B2 | 11/2008 | Dolan |
| 7,553,514 B2 | 6/2009 | Fan et al. |
| 7,645,519 B2 | 1/2010 | Garamszegi et al. |
| 7,678,852 B2 | 3/2010 | Kaprinidis |
| 7,776,447 B2 | 8/2010 | Krawczyk |
| 7,804,228 B2 | 9/2010 | Sadaka et al. |
| 7,837,439 B2 | 11/2010 | Bech |
| 7,887,921 B2 | 2/2011 | Varanasi et al. |
| 8,069,680 B2 | 12/2011 | Hyde et al. |
| 8,088,498 B2 | 1/2012 | Smith et al. |
| 8,211,516 B2 | 7/2012 | Bowers et al. |

(56) References Cited

U.S. PATENT DOCUMENTS

| | | | |
|---|---|---|---|
| 8,215,518 B2 | 7/2012 | Hyde et al. |
| 8,215,835 B2 | 7/2012 | Hyde et al. |
| 8,231,958 B2 | 7/2012 | Hoover et al. |
| 8,247,050 B2 | 8/2012 | McCrea et al. |
| 8,303,247 B2 | 11/2012 | Schlichting et al. |
| 8,313,288 B2 | 11/2012 | Schlichting et al. |
| 8,322,147 B2 | 12/2012 | Hyde et al. |
| 8,366,391 B2 | 2/2013 | Tsukagoshi et al. |
| 8,377,030 B2 | 2/2013 | Hyde et al. |
| 8,394,473 B2 | 3/2013 | McCrea et al. |
| 8,394,507 B2 | 3/2013 | Tomantschger et al. |
| 8,431,222 B2 | 4/2013 | Paul |
| 8,485,387 B2 | 7/2013 | Bowers et al. |
| 8,500,410 B2 | 8/2013 | De Moura et al. |
| 8,603,598 B2 | 12/2013 | Hyde et al. |
| 8,715,439 B2 | 5/2014 | Chakrabarti et al. |
| 8,764,959 B2 | 7/2014 | Smith et al. |
| 8,814,527 B2 | 8/2014 | Huth et al. |
| 2001/0054379 A1 | 12/2001 | Choy et al. |
| 2003/0070387 A1 | 4/2003 | Klocke et al. |
| 2003/0183416 A1 | 10/2003 | White et al. |
| 2004/0222103 A1 | 11/2004 | Marsales et al. |
| 2005/0115839 A1 | 6/2005 | Dolan |
| 2005/0175813 A1 | 8/2005 | Wingert et al. |
| 2005/0271859 A1 | 12/2005 | Tuss et al. |
| 2006/0188730 A1 | 8/2006 | Varanasi et al. |
| 2006/0222846 A1 | 10/2006 | Ackerman et al. |
| 2007/0044765 A1 | 3/2007 | Lincourt |
| 2007/0172643 A1 | 7/2007 | Krawczyk |
| 2007/0184288 A1 | 8/2007 | Garamszegi et al. |
| 2007/0251389 A1 | 11/2007 | Katsir et al. |
| 2008/0050600 A1 | 2/2008 | Fan et al. |
| 2009/0082494 A1 | 3/2009 | Kaprinidis |
| 2009/0087640 A1* | 4/2009 | Li ................... H05K 7/20981 428/304.4 |
| 2009/0092842 A1 | 4/2009 | Hoover et al. |
| 2009/0098373 A1 | 4/2009 | Dolan |
| 2009/0142193 A1 | 6/2009 | Bech |
| 2009/0145163 A1 | 6/2009 | Hyde et al. |
| 2009/0145164 A1 | 6/2009 | Hyde et al. |
| 2009/0145793 A1 | 6/2009 | Hyde et al. |
| 2009/0145910 A1 | 6/2009 | Hyde et al. |
| 2009/0145911 A1 | 6/2009 | Hyde et al. |
| 2009/0145912 A1 | 6/2009 | Hyde et al. |
| 2009/0151852 A1 | 6/2009 | Roebroeks |
| 2009/0156939 A1 | 6/2009 | Sadaka et al. |
| 2009/0169368 A1 | 7/2009 | Schlichting et al. |
| 2009/0226746 A1 | 9/2009 | Chakrabarti et al. |
| 2009/0283534 A1 | 11/2009 | Bowers et al. |
| 2009/0286022 A1 | 11/2009 | Bowers et al. |
| 2010/0014964 A1 | 1/2010 | Smith et al. |
| 2010/0018981 A1 | 1/2010 | Hyde et al. |
| 2010/0084037 A1 | 4/2010 | Ericsson et al. |
| 2010/0213200 A1 | 8/2010 | Deane et al. |
| 2010/0226783 A1 | 9/2010 | Lipkin et al. |
| 2010/0232974 A1 | 9/2010 | De Moura et al. |
| 2010/0236703 A1 | 9/2010 | Schneider et al. |
| 2010/0266391 A1 | 10/2010 | Schlichting et al. |
| 2010/0304063 A1 | 12/2010 | McCrea et al. |
| 2010/0304065 A1 | 12/2010 | Tomantschger et al. |
| 2010/0304171 A1 | 12/2010 | Tomantschger et al. |
| 2010/0325855 A1 | 12/2010 | Sadaka et al. |
| 2011/0033308 A1 | 2/2011 | Huth et al. |
| 2011/0127273 A1 | 6/2011 | Deane et al. |
| 2011/0142597 A1 | 6/2011 | Tsukagoshi et al. |
| 2011/0155745 A1 | 6/2011 | Chou et al. |
| 2011/0286854 A1 | 11/2011 | Watson |
| 2011/0287223 A1 | 11/2011 | Victor et al. |
| 2011/0308201 A1 | 12/2011 | Hyde et al. |
| 2012/0000918 A1 | 1/2012 | Deane et al. |
| 2012/0061243 A1 | 3/2012 | Smith et al. |
| 2012/0082541 A1 | 4/2012 | Macchia et al. |
| 2012/0082553 A1 | 4/2012 | Eleftheriou et al. |
| 2012/0082559 A1 | 4/2012 | Guglielmin et al. |
| 2012/0085070 A1 | 4/2012 | Chou et al. |
| 2012/0152893 A1 | 6/2012 | Parkos et al. |
| 2012/0174508 A1 | 7/2012 | Brooks et al. |
| 2012/0275968 A1 | 11/2012 | Puntambekar |
| 2012/0321906 A1 | 12/2012 | McCrea et al. |
| 2013/0034725 A1 | 2/2013 | Paul |
| 2013/0143058 A1 | 6/2013 | McCrea et al. |
| 2014/0053970 A1 | 2/2014 | Hyde et al. |
| 2014/0057073 A1 | 2/2014 | Hyde et al. |
| 2014/0120320 A1* | 5/2014 | Kanai ................. C09D 183/14 428/172 |
| 2016/0160681 A1* | 6/2016 | Roach .................... C25D 7/00 415/177 |

FOREIGN PATENT DOCUMENTS

| | | | |
|---|---|---|---|
| EP | 2469025 A2 | 6/2012 | |
| JP | 05157190 A | 6/1993 | |
| JP | 06170514 A | 6/1994 | |
| JP | 06315919 A | 11/1994 | |
| JP | 2008062511 A | 3/2008 | |
| JP | 2010001511 A | 1/2010 | |
| JP | WO 2012173277 A1 * | 12/2012 | ........... C09D 183/14 |
| KR | 1020070104792 A | 10/2007 | |
| WO | 0146324 A2 | 6/2001 | |
| WO | 2012058470 A1 | 5/2012 | |

OTHER PUBLICATIONS

English Abstract for Japanese Application No. JP2010001511; Filing date: Jan. 7, 2010.

English Abstract for Japanese Publication No. 06-315919; Date of Publication: Nov. 15, 1994.

International Search Report for International application No. PCT/US2014/045907; International filing date: Jul. 9, 2014; dated Oct. 24, 2014.

International Search Report for International Application No. PCT/US2014/045911; International filing date: Jul. 9, 2014; dated Oct. 30, 2014.

International Search Report for International Application No. PCT/US2014/045913; International filing date: Jul. 9, 2014; dated Oct. 20, 2014.

International Search Report for International application No. PCT/US2014/045921; International filing date: Jul. 9, 2014; dated Oct. 30, 2014.

International Search Report for International Application No. PCT/US2014/045932; International Filing Date: Jul. 9, 2014; dated Oct. 27, 2014.

International Search Report for International Application No. PCT/US2014/046012; International filing date: Jul. 9, 2014; dated Oct. 28, 2014.

International Search Report for International application No. PCT/US2014/046013; International Filing Date: Jul. 9, 2014; dated Oct. 27, 2014.

International Search Report for International application No. PCT/US2014/046017; International filing date: Jul. 9, 2014; dated Oct. 29, 2014.

International Search Report for International Application No. PCT/US2014/045879; International Filing Date: Jul. 9, 2014; dated Oct. 17, 2014.

PCT Written Opinion for International Application No. PCT/US2014/045913; International filing date: Jul. 9, 2014; dated Oct. 20, 2014.

PCT Written Opinion for International Application No. PCT/US2014/045932; International Filing Date: Jul. 9, 2014; dated Oct. 27, 2014.

PCT International Search Report for International application No. PCT/US2014/045929; International filing date: Jul. 9, 2014; dated Apr. 17, 2015.

PCT Written Opinion for International application No. PCT/US2014/045929; International filing date: Jul. 9, 2014; dated Apr. 17, 2015.

PCT Written Opinion for International application No. PCT/US2014/045907; International filing date: Jul. 9, 2014; dated Oct. 24, 2014.

PCT Written Opinion for International application No. PCT/US2014/046013; International filing date: Jul. 9, 2014; dated Oct. 27, 2014.

PCT Written Opinion for International Application No. PCT/US2014/046012; International filing date: Jul. 9, 2014; dated Oct. 28, 2014.

(56) References Cited

OTHER PUBLICATIONS

PCT Written Opinion for International application No. PCT/US2014/046017; International filing date: Jul. 9, 2014; dated Oct. 29, 2014.
PCT Written Opinion for International Application No. PCT/US2014/045911; International filing date: Jul. 9, 2014; dated Oct. 30, 2014.
PCT Written Opinion for International Application No. PCT/US2014/045879; International Filing Date: Jul. 9, 2014; dated Oct. 17, 2014.
PCT Written Opinion for International application No. PCT/US2014/045921; International filing date: Jul. 9, 2014; dated Oct. 30, 2014.

* cited by examiner

EROSION AND WEAR PROTECTION FOR COMPOSITES AND PLATED POLYMERS

CROSS-REFERENCE TO RELATED APPLICATIONS

This application claims priority under 35 U.S.C. § 119(e) to U.S. Provisional Patent Application Ser. No. 61/844,108 filed on Jul. 9, 2013.

FIELD OF THE DISCLOSURE

The present disclosure generally relates to composite components and metal-plated polymer components having improved physical properties. More particularly, this disclosure relates to composite components and plated polymer components having improved resistance against erosion, corrosion, and/or wear.

BACKGROUND

Organic matrix composite materials consist of an organic matrix structurally reinforced with carbon fibers, metallic fibers, and/or glass fibers. As components formed from these materials are lightweight and dimensionally stable, they are attractive materials for applications in numerous industries such as aerospace, automotive, and sporting industries. For example, these materials are commonly used in the construction of nose cones, fan exit guide vanes, and bifurcation ducts in gas turbine engines. However, organic matrix composite materials may suffer from performance limitations and structural damage due to their weak resistance to erosion which may occur upon exposure to objects in the environment such as dirt, sand, or small particles. With respect to gas turbine engine applications, such limitations have largely restricted the use of this family of materials as structures in certain gas-path regions of gas turbine engines. Several protective measures have been employed to improve the erosion resistance of organic matrix composites and extend their operative lifetimes. One such protective measure involves bonding metallic sheaths or applying a metallic coating to selected surfaces of composite components during and/or after the fabrication of the composite component. However, when these protective metallic coatings are in direct contact with the underlying composite material, a galvanic couple may be formed between the metallic coating and the carbon or metallic fibers of the composite material and eventually wear down the metallic coating and adversely affect its performance. As an alternative strategy, corrosion- and erosion-resistant titanium layers may be applied to the surfaces of organic composite materials, but the deposition of titanium (as opposed to aluminum) directly on such composite surfaces is technically difficult.

Metal-plated composites and metal-plated polymers (collectively referred to as "plated polymers") are also attractive materials for component fabrication in various industries which require lightweight and high strength parts such as aerospace and automotive industries. Current metal plating methods used for the fabrication of plated polymer components may result in a near uniform thickness of the metal plating layer across the part. However, metal plating surfaces of plated polymer components may be damaged in certain areas by scratches, nicks, or gouges during or after manufacture and may require repair. In addition, certain regions of metal plating layers, such as regions having enhanced susceptibility to wear or erosion, or regions requiring post-machining operations to shape a detail, may require a thicker metal plating layers to provide increased surface durability. Wear-critical surfaces may include, for example, surfaces involved in interference fits (or friction fits) with other parts and which are installed and uninstalled frequently. Erosion-susceptible surfaces may include edges, corner radii, or curved surfaces of moving components which may experience enhanced impact with particles in the air.

Clearly, improved systems are needed to enhance the erosion resistance of organic composite materials to further promote their use in a variety of industries. Likewise, there is also a need for methods which allow selective thickening of metal plating layers in wear-critical regions, erosion-susceptible regions, or damaged regions of metal-plated polymer components without thickening the entire metal plating layer and adding unnecessary weight to the part.

SUMMARY OF THE DISCLOSURE

In accordance with one aspect of the present disclosure, a composite component is disclosed. The composite component may comprise a body portion formed from an organic matrix composite and a first metal coating applied to a surface of the body portion. The first metal coating may be formed from aluminum or an aluminum alloy. The composite component may further comprise an outer metal layer on the first metal coating.

In another refinement, the organic matrix composite may consist of an organic matrix and reinforcing fibers.

In another refinement, the outer metal layer may be a passive aluminum oxide layer formed by anodizing a surface of the first metal coating.

In another refinement, the outer metal layer may be a titanium dioxide coating.

In another refinement, the titanium dioxide coating may be applied to a surface of the first metal coating by electrolytic deposition.

In another refinement, the outer metal layer may be a metal plating layer.

In another refinement, the composite component may further comprise a sacrificial layer between the first metal coating and the metal plating layer, and the sacrificial layer may be formed from a metallic material that is more anodic than a metal composition of the first metal coating.

In another refinement, the sacrificial layer may be formed from zinc.

In accordance with another aspect of the present disclosure, a composite component is disclosed. The composite component may have a body portion formed from an organic matrix composite, a first metal coating applied to a surface of the body portion, and an outer metal layer on the first metal coating. The composite component may be formed by a method comprising: 1) forming the body portion in a desired shape from an organic matrix material and reinforcing fibers, 2) depositing the first metal coating on a surface of the body portion, and 3) forming the outer metal layer on the first metal coating.

In another refinement, depositing the first metal coating on the surface of the body portion may comprise depositing the first metal coating by a method selected from the group consisting of cathodic arc deposition, ion vapor deposition, physical vapor deposition, and chemical vapor deposition.

In another refinement, forming the outer metal layer on the first metal coating may comprise anodizing a surface of the first metal coating to produce a passive oxide layer.

In another refinement, forming the outer metal layer on the first metal coating comprises depositing a titanium dioxide layer on a surface of the first metal coating.

In another refinement, forming the outer metal layer on the first metal coating comprises depositing a metal plating layer by a method selected from the group consisting of electrolytic deposition, electroforming, and electroless deposition.

In accordance with another aspect of the present disclosure, a plated polymer component is disclosed. The plated polymer component may comprise a polymer substrate, a metal plating layer applied to a surface of the polymer substrate, and at least one selectively thickened region in the metal plating layer.

In another refinement, the at least one selectively thickened region may be located at a wear-critical region of the plated polymer component.

In another refinement, the wear-critical region may be a region forming an interference fit or a mating surface.

In another refinement, the at least one selectively thickened region may be located at an erosion-susceptible region of the plated polymer component.

In another refinement, the at least one selectively thickened region may be located at a region of the plated polymer component requiring a post-machining operation.

In another refinement, the at least one selectively thickened region may be applied to a surface of the metal plating layer by brush electroplating.

These and other aspects and features of the present disclosure will be more readily understood when read in conjunction with the accompanying drawings.

It should be understood that the drawings are not necessarily drawn to scale and that the disclosed embodiments are sometimes illustrated schematically and in partial views. It is to be further appreciated that the following detailed description is merely exemplary in nature and is not intended to limit the invention or the application and uses thereof. In this regard, it is to be additionally appreciated that the described embodiment is not limited to use for certain applications. Hence, although the present disclosure is, for convenience of explanation, depicted and described as certain illustrative embodiments, it will be appreciated that it can be implemented in various other types of embodiments and in various other systems and environments.

DETAILED DESCRIPTION

Figures 1, 2:
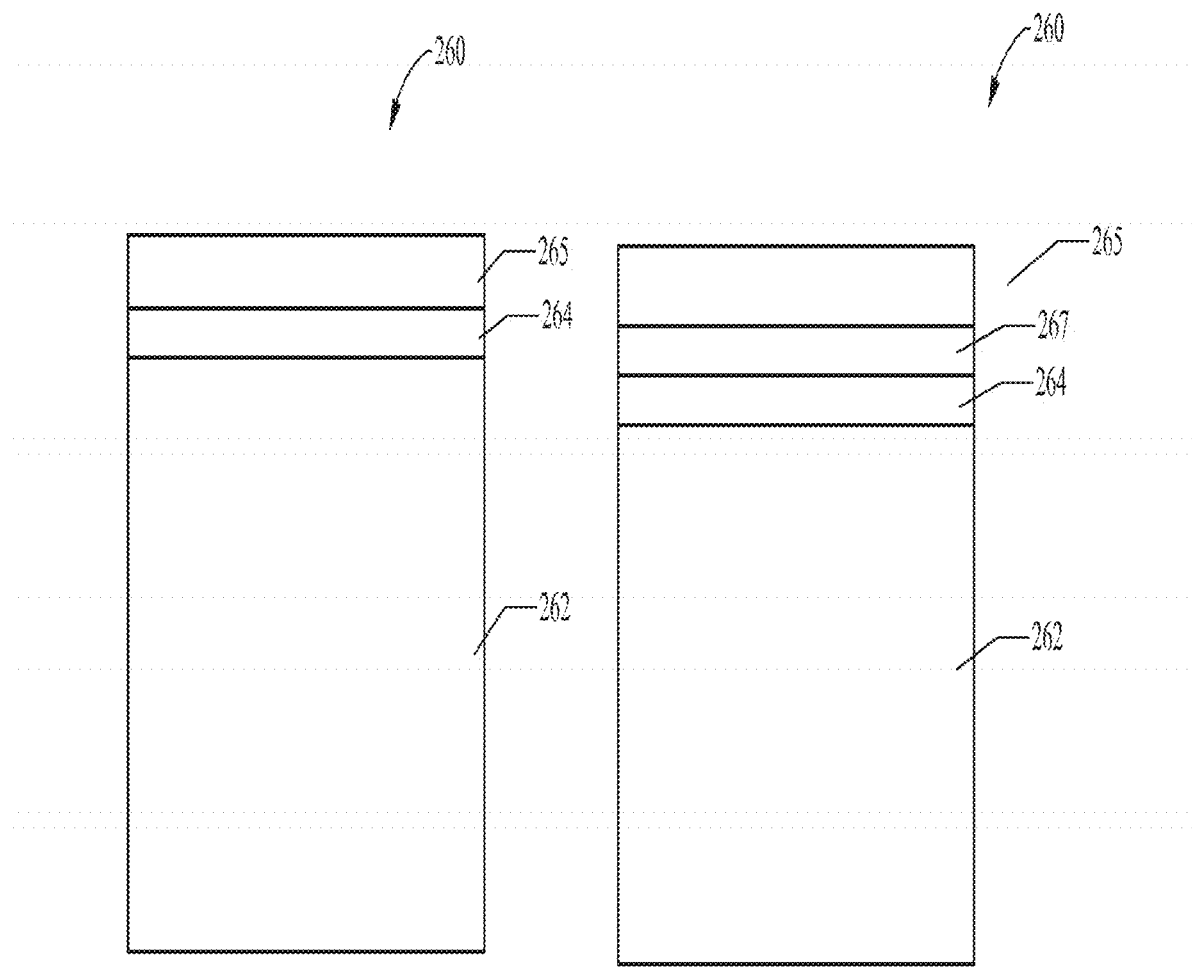
FIG. 1 is a front view of a composite component having a first metal coating and an outer metal layer, constructed in accordance with the present disclosure.
FIG. 2 is a front view similar to FIG. 1, but having a sacrificial layer between the first metal coating and the outer metal layer, constructed in accordance with the present disclosure.

Metallic Coating on Composites for the Purpose of Applying Erosion and Galvanic Protection Referring now to FIG. 1, a composite component 260 is shown. The composite component 260 may have a body portion 262 with a first metal coating 264 applied to one or more of its outer surfaces, as shown. In addition, an outer metal layer 265 may be formed on the first metal coating 264. The composite component 260 may be a component designed for use in a gas turbine engine, including gas path regions of the engine. For example, the composite component 260 may be a structure of a gas turbine engine such as, but not limited to, a fan blade, a compressor blade, a compressor vane, a duct, or a case. Alternatively, the composite component 260 may be a structural or operative component designed for use in another application such as, for example, aerospace, automotive, or sporting applications. Moreover, the composite component 260 may have any shape suitable for its intended use, and therefore, may deviate significantly from the exemplary box-like shape shown. Notably, the first metal coating 264 and the outer metal layer 265 may impart the composite component 260 with advantageous properties such as improved resistance against erosion and galvanic corrosion as well as increased ductility and stiffness (see further details below).

The body portion 262 of the composite component 260 may be formed from an organic matrix composite consisting of an organic matrix and one or more reinforcing fibers. The organic matrix may consist of an epoxy resin, a bismaleimide resin, a polyimide, a thermoplastic material, or combinations thereof. Alternatively, the organic matrix may be formed form another suitable polymer composition selected by a skilled artisan. The reinforcing fibers may be carbon fibers, glass fibers, metallic fibers, aramid fibers, or combinations thereof.

The first metal coating 264 may be formed from a metal such as aluminum or an aluminum alloy. It may be applied to selected outer surfaces of the body portion 262 by a coating method well-known to those having ordinary skill in the art such as, but not limited to, cathodic arc deposition, ion vapor deposition, physical vapor deposition, or chemical vapor deposition. The first metal coating 264 may protect the underlying body portion 262 of the composite component 260 from erosion. In addition, the outer surfaces of the body portion 262 which are coated with the first metal coating 264 may exhibit conductive properties such that the deposition of additional metallic layers thereon may be performed without the need for catalyst precursors and metalized layers that are typically used to create conductive surfaces on polymeric substrates.

The first metal coating 264 may be used as a precursor to a more erosion capable coating forming the outer metal layer 265. In particular, the outer metal layer 265 may consist of an erosion-resistant coating that may also eliminate or at least mitigate galvanic corrosion between the first metal coating 264 and the reinforcement fibers in the organic matrix composite. In this way, the outer metal layer 265 may assist in maintaining the performance and structure of the first metal coating 264 as well as the composite component 260 as a whole. As one possibility, the outer metal layer 265 may be formed by anodizing the surface of the first metal coating 264 in order to increase the thickness of an erosion-resistant and corrosion-resistant natural passive oxide layer on the surface of the first metal coating 264. For example, if the first metal coating 264 is formed from aluminum, the outer surface of the aluminum coating may be anodized by an electrolytic process known to those having ordinary skill in the art in order to generate an outer metal layer 265 formed from a passive aluminum oxide coating that is inert to erosion and corrosion. As an alternative arrangement, the outer metal layer 265 may consist of a titanium dioxide coating such as Alodine® EC$^2$™ sold by Henkel located in Dusseldorf, Germany. The titanium dioxide coating may be resistant to corrosion and erosion and may be applied to the surface of the first metal coating 264 by an electrolytic deposition method apparent to those having ordinary skill in the art.

As yet another alternative arrangement, the outer metal layer 265 may consist of one or more metal plating layers which may contain one or more platable metals having stiff properties such as, but not limited to, nickel, cobalt, nickel-cobalt alloys, cobalt-tungsten alloys, copper, iron, gold, silver, palladium, rhodium, chromium, zinc, and combinations thereof. The metal plating may have a nobility in the galvanic series similar to or higher than the composite material of the body portion 262, including any potential reinforcing materials. As the first metal coating 264 may advantageously impart the coated outer surfaces of the body portion 262 with conductive properties, the metal plating may be directly deposited on the coated outer surfaces of the body portion 262 by metal deposition methods apparent to those having ordinary skill in the art such as, but not limited to, electroless (current-free) deposition, electrolytic deposition, or electroforming, without the usual necessity for composite surface activation and metallization. The metal plating layer may be erosion resistant and may prevent galvanic corrosion from occurring between the first metal coating 264 and the reinforcement fibers in the body portion 262, while improving the ductility and stiffness of the composite component 260 as a whole. Furthermore, by employing known tailored racking techniques such as shields, current thieves, and/or conformal anodes during the deposition of the metal plating, the thickness of the metal plating may be selectively adjusted in different regions of the outer surfaces of the body portion 262 to tune the stiffness and/or erosion and corrosion resistance of the component in specific regions to meet component performance requirements.

If the outer metal layer 265 is formed from a metal plating and a galvanic interaction between the metal plating and the first metal coating 264 is a concern, an optional sacrificial layer 267 may be deposited between the outer metal layer 265 and the first metal coating 264, as shown in FIG. 2. The sacrificial layer 267 may prevent or slow down the rate of galvanic corrosion between the outer metal layer 265 and the first metal coating 264. In this way, the sacrificial layer 267 may act as a sacrificial anode and may be formed from a metallic material which is more anodic than the metal composition of the first metal coating 264. For example, if the first metal coating 264 is formed from aluminum or an aluminum alloy, the sacrificial layer 267 may be formed from zinc. The sacrificial layer 267 may be deposited on the first metal coating 264 by an electrolytic deposition process understood by those having ordinary skill in the art.

Figure 3:
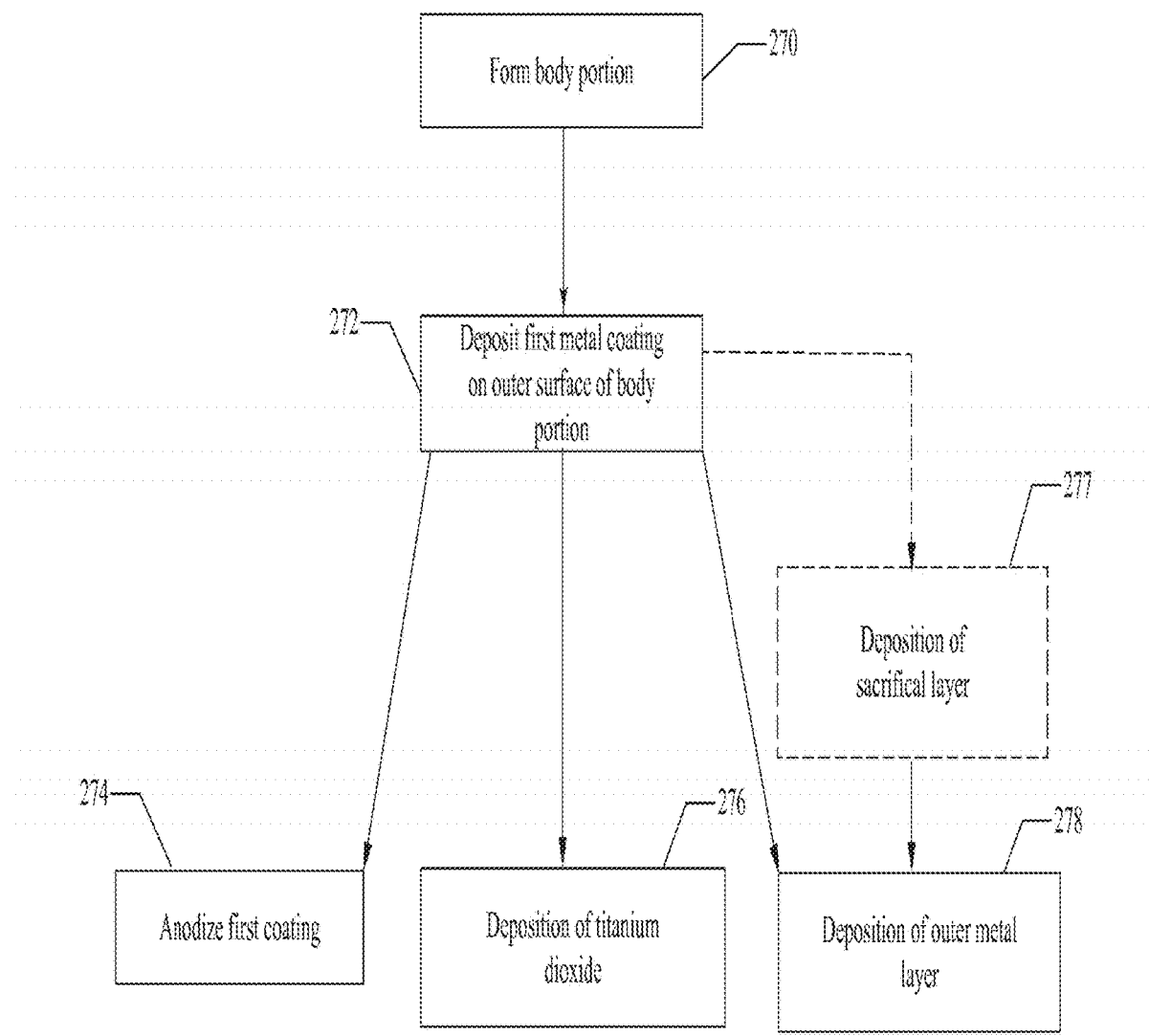
FIG. 3 is a flow chart illustrating the fabrication of the composite component in accordance with a method of the present disclosure.

A method which may be employed for the fabrication of the composite component 260 is depicted in FIG. 3. According to a first block 270, the body portion 262 of the composite component 260 may be formed in a desired shape from the selected organic matrix materials and reinforcement fibers. The forming of the body portion 262 may be carried out using a polymer forming process apparent to those of ordinary skill in the art including, but not limited to, injection molding, compression molding, blow molding, additive manufacturing (liquid bed, powder bed, deposition process), or composite layup (autoclave, compression, or liquid molding). According to a next block 272, the first metal coating 264 may then be deposited directly on selected outer surfaces of the body portion 262 by cathodic arc deposition, ion vapor deposition, physical vapor deposition, chemical vapor deposition, or another suitable technique chosen by a skilled artisan.

Following the block 272, the outer metal layer 265 may be formed on the first metal coating 264 by one of the blocks 274, 276, or 278, as shown. According to the block 274, the surface of the first metal coating 264 may be anodized to form a corrosion- and erosion-resistant passive oxide layer, such as an aluminum oxide layer if the first metal coating 264 contains aluminum. As another option, a corrosion- and erosion-resistant titanium dioxide layer may be electrolytically deposited on the surface of the first metal coating 264, according to the block 276. As a third option, a metal plating having a desired composition may be deposited on the surface of the first metal coating 264 by electroless deposition, electrolytic deposition, electroforming, or another metal deposition process selected by a skilled artisan, according to the block 278. Prior to the block 278, the sacrificial layer 267 may first be deposited on the surface of the first metal coating 264 by electrolytic deposition according to an optional block 277, as shown.

Selective Local Wear and Erosion Protection for Plated Polymeric Components

Figure 4:
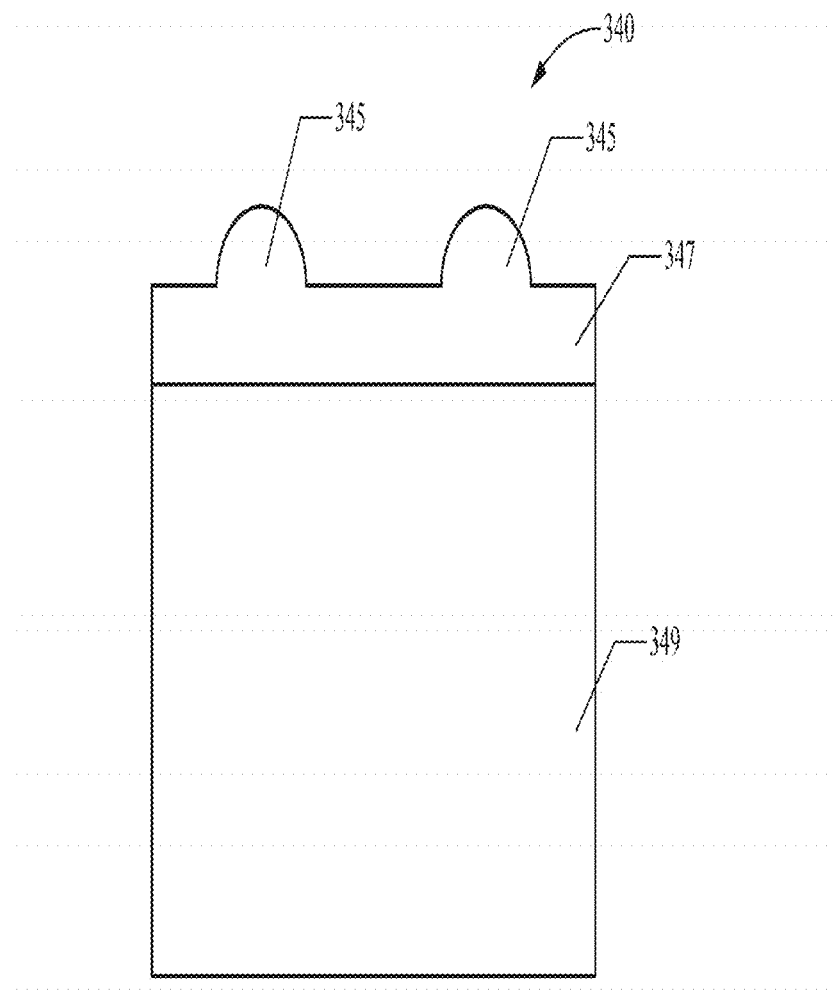
FIG. 4 is a front view illustrating a plated polymer component having selectively thickened regions on a metal plating layer, constructed in accordance with the present disclosure.

Referring now to FIG. 4, a plated polymer component 340 having one or more selectively thickened regions 345 on an outer metal plating layer 347 is shown. The plated polymer component 340 may consist of a polymer substrate 349 having one or more of the metal plating layers 347 applied to one or more of its outer surfaces. The plated polymer component 340 may be a structural or operative component designed for use in a range of applications such as, but not limited to, gas turbine engine applications. Accordingly, in practice, it may have any shape suitable for its intended use and may deviate substantially from the exemplary structure shown. As one non-limiting example, the component 340 may be a spinner of a gas turbine engine fan.

The thickened regions 345 may be regions of the metal plating layer 347 requiring enhanced strength and durability for protection against wear and/or erosion. For example, they may be wear-critical regions of the component 340 such as regions forming interference fits or mating surfaces, or they may be erosion-susceptible regions of the component 340 such as edges, corner radii, or curved surfaces. The thickened regions 345 may also be regions of the component 340 requiring post-machining operations to machine a detail or to meet tight tolerances. The shape, thickness, and area of the thickened regions 345 may vary significantly depending on numerous factors such as durability requirements, post-machining requirements, and the intended use of the component 340. Moreover, as can be appreciated, the location, number, and distribution pattern of the thickened regions 345 on the metal plating layer 347 may also vary as necessary to meet the durability requirements and/or the post-machining requirements of the component 340. Importantly, the thickened regions 345 may be selectively applied to localized regions of the metal plating layer 347 as needed, without thickening the remainder of the metal plating layer 347 and adding unnecessary weight to the part. In particular, the thickened regions 345 may be selectively applied to localized regions of the metal plating layer 347 by brush electroplating (see details below) or another similar process apparent to those of ordinary skill in the art.

Figure 5:
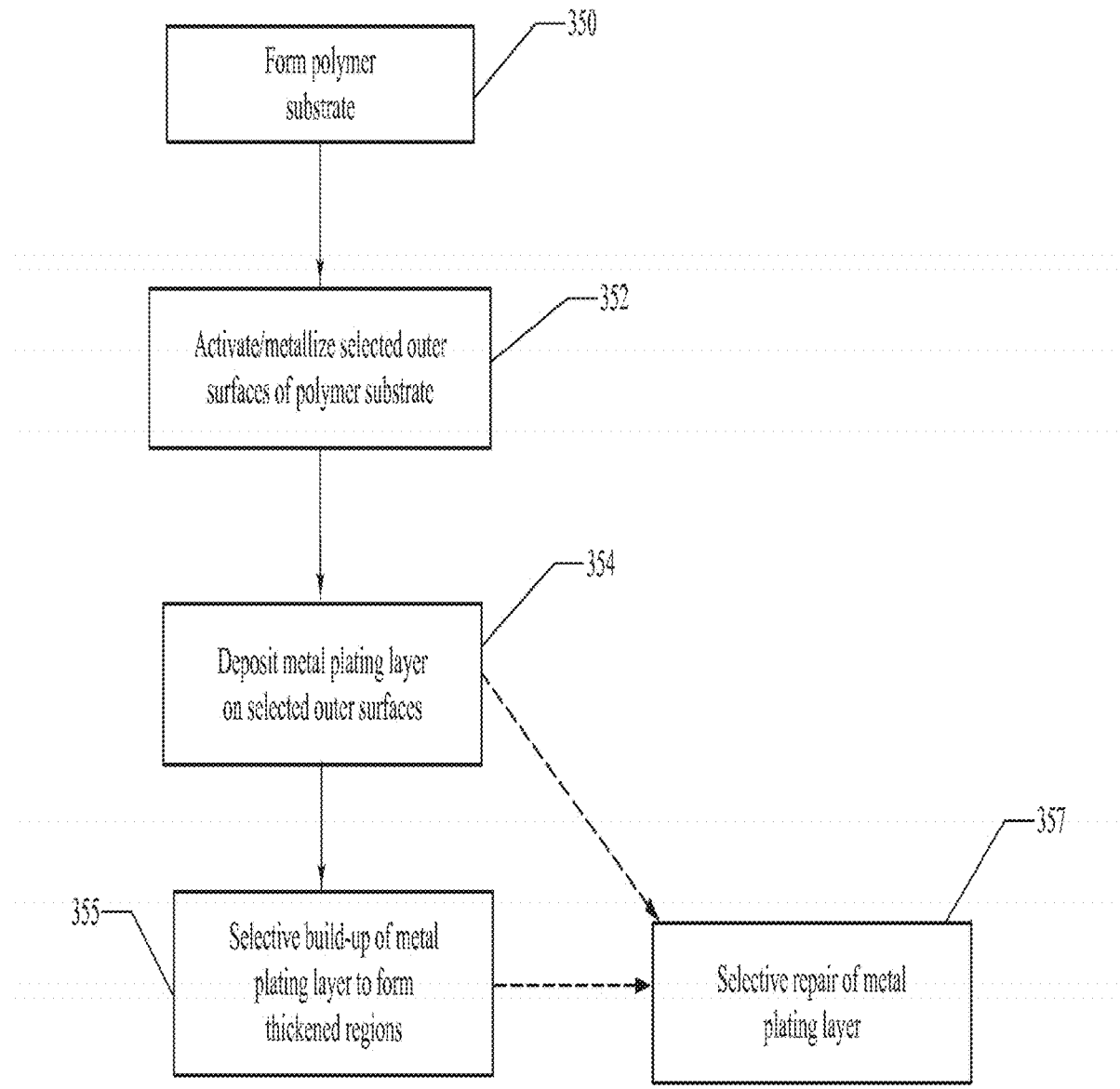
FIG. 5 is a flow chart illustrating steps involved in fabricating plated polymer components having the selectively thickened regions, in accordance with a method of the present disclosure.

FIG. 5 illustrates a method for fabricating plated polymer components having selectively thickened regions 345 on the metal plating layer 347 as well as for selectively repairing the metal plating layer 347. According to a first block 350, the polymer substrate 349 may be formed in a desired shape suitable for its intended application. The polymer substrate 349 may be formed from a thermoplastic or a thermoset material with optional fiber reinforcement with fibers such as carbon fiber or glass fiber. Suitable thermoplastic materials may include, but are not limited to, polyetherimide (PEI), thermoplastic polyimide, polyether ether ketone (PEEK), polyether ketone ketone (PEKK), polysulfone, polyamide, polyphenylene sulfide, polyester, polyimide, and combinations thereof. Suitable thermoset materials may include, but are not limited to, condensation polyimides, addition polyimides, epoxy cured with aliphatic and/or aromatic amines and/or anhydrides, cyanate esters, phenolics, polyesters, polybenzoxazine, polyurethanes, polyacrylates, polymethacrylates, silicones (thermoset), and combinations thereof. The polymer substrate 349 may be formed in the desired shape from the selected materials using a range of established processes including, but not limited to, injection molding, compression molding, blow molding, additive manufacturing (liquid bed, powder bed, deposition processes), or composite layup (autoclave, compression, or liquid molding).

Following the block 350, the outer surfaces of the polymer substrate 349 which are selected for plating with the metal plating layer 347 may be suitably activated and metallized to make the selected outer surfaces of the polymer substrate 349 conductive according to a block 352. Activation and metallization of the selected outer surfaces of the polymer substrate 349 may be carried out using well-established techniques in the industry. According to a next block 354, one or more metal plating layers 347 may be then deposited on the activated and metallized outer surfaces of the polymer substrate 349, as shown. Deposition of the metal plating layer 347 may be carried out using metal deposition processes apparent to those having ordinary skill in the art such as, but not limited to, electrolytic plating, electroless plating, or electroforming. During the block 354, the metal plating layer 347 may be deposited at a uniform thickness or at least a substantially uniform thickness. In addition, if less than all of the outer surfaces of the polymer substrate 349 are selected for plating, conventional masking techniques may be employed during the block 354 to prevent metal deposition on the non-selected surfaces, as will be apparent to those skilled in the art.

Subsequent to the block 354, selective thickening (or build-up) of the metal plating layer 347 may be performed in to provide one or more thickened regions 345 in localized areas according to a next block 355. As explained above, the areas of the metal plating layer 347 selected for thickening may be chosen according to those areas which are susceptible to wear or erosion or which require post-machining operations. Selective thickening of the metal plating layer 347 may be carried out using brush electroplating or another selective plating process chosen by a skilled artisan. As is apparent to those having ordinary skill in the art, brush electroplating may involve the use of a brush which may be saturated with a plating solution containing the desired metal. The brush may be connected to the positive side of a current source, the polymer substrate 349 may be connected to the negative side of the current source, and the user may brush the plating solution on the metal plating layer 347 to build-up thickened regions 345 where desired. Brush electroplating may also allow the user to manually control the location, shape, and thickness of the thickened regions 345 according to the durability requirements and/or post-machining requirements, without affecting other areas of the metal plating layer 347. Moreover, brush electroplating may be run faster than other conventional plating methods. It is also noted that the block 357 may be carried out in conjunction with racking tools which may further assist selective build-up of the thickened regions. Such racking tools may include shields, current thieves, or other similar tools that are well-established in the industry.

After the block 354 or the block 355, selective repair of any scratches, nicks, gouges, or any other defects in the metal plating layer 347 may also be optionally carried out as necessary according to a block 357. Such repair may be performed as a manufacturing step or as needed during use and may help restore the component to original equipment manufacturer (OEM) condition. The block 357 may be performed using selective brush electroplating or another similar selective plating process chosen by a skilled artisan.

INDUSTRIAL APPLICABILITY

From the foregoing, it can therefore be seen that the present disclosure can find industrial applicability in many situations, including, but not limited to, erosion and wear protection of composite components and plated polymer components. In particular, by directly coating selected outer surfaces of organic matrix composite components with a metal coating, such as aluminum or an aluminum alloy, the outer surfaces of the composite components may become conductive such that the deposition of additional metal plating layers thereon may be achieved without the need for standard surface activation and metallization procedures. This arrangement may be exploited for coating outer surfaces of the composite component with more erosion-capable metal platings which may also reduce or eliminate galvanic corrosion between the first metal coating and the composite component, while improving the ductility and/or stiffness of the component as a whole. Alternatively, the surface of the metal coating which is in contact with the composite component may be anodized to form an erosion- and corrosion-resistant passive metal oxide layer. The composite components disclosed herein may therefore exhibit improved erosion resistance, resistance against galvanic corrosion, and increased stiffness compared with current organic matrix composite materials such that the use of organic matrix composite materials may be extended to areas of the gas turbine engine to which they have traditionally been restricted, such as gas-path regions.

The technology as disclosed herein also takes advantage of brush electroplating or other similar selective plating processes to selectively thicken or repair metal plating layers in localized areas on plated polymer parts without affecting and adding unnecessary weight to other areas of the part. This locally thickened plating may be used to increase part durability on wear surfaces such as such as surfaces involved in forming interference fits with other parts. It may also be applicable to part features such as edges and corner radii, which often experience enhanced susceptibility to erosion. Furthermore, selective thickening of metal plating layers may offer the ability to plate at a greater than desired plating thickness to allow for subsequent machining of details or features. The technology as disclosed herein may find wide industrial applicability in a wide range of areas including, but not limited to, aerospace, automotive, and military equipment industries.

What is claimed is:

1. A composite component, comprising:
   a body portion formed from an organic matrix composite;
   a first metal coating applied to a surface of the body portion, the first metal coating being formed from aluminum or an aluminum alloy; and
   an outer metal layer on the first metal coating, wherein the outer metal layer has a nobility in the galvanic series equal to or higher than the organic matrix composite of the body portion.

2. The composite component of claim 1, wherein the organic matrix composite consists of an organic matrix and reinforcement fibers.

3. The composite component of claim 2, wherein the outer metal layer is a metal plating layer.

4. The composite component of claim 3, further comprising a sacrificial layer between the first metal coating and the metal plating layer, the sacrificial layer being formed from a metallic material that is more anodic than a metal composition of the first metal coating.

5. The composite component of claim 4, wherein the sacrificial layer is formed from zinc.

6. A composite component having a body portion formed from an organic matrix composite, a first metal coating applied to a surface of the body portion, and an outer metal layer on the first metal coating, the composite component being formed by a method comprising:
   forming the body portion in a desired shape from an organic matrix material and reinforcing fibers;
   depositing the first metal coating on the surface of the body portion; and
   forming the outer metal layer on the first metal coating, wherein the outer metal layer has a nobility in the galvanic series equal to or higher than the organic matrix composite of the body portion.

7. The composite component of claim 6, wherein depositing the first metal coating on the surface of the body portion comprises depositing the first metal coating by a method selected from the group consisting of cathodic arc deposition, ion vapor deposition, physical vapor deposition, and chemical vapor deposition.

8. The composite component of claim 6, wherein forming the outer metal layer on the first metal coating comprises depositing a metal plating layer by a method selected from the group consisting of electrolytic deposition, electroforming, and electroless deposition.

9. The composite component of claim 8, wherein the method further comprises depositing a sacrificial layer on a surface of the first metal coating prior to depositing the metal plating layer.

\* \* \* \* \*